US007969208B2

(12) United States Patent
Jansen

(10) Patent No.: US 7,969,208 B2
(45) Date of Patent: Jun. 28, 2011

(54) CONTROL CIRCUIT FOR A POWER SEMICONDUCTOR ASSEMBLY AND POWER SEMICONDUCTOR ASSEMBLY

(75) Inventor: Uwe Jansen, Werl (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/646,112

(22) Filed: Dec. 23, 2009

(65) Prior Publication Data

US 2010/0164601 A1 Jul. 1, 2010

(30) Foreign Application Priority Data

Dec. 23, 2008 (DE) .......................... 10 2008 055 157

(51) Int. Cl.
*H03K 3/00* (2006.01)
(52) U.S. Cl. .......................... 327/110; 327/423; 327/588
(58) Field of Classification Search .................. 327/108, 327/112, 423, 588
See application file for complete search history.

(56) References Cited

U.S. PATENT DOCUMENTS

| 5,166,541 A | 11/1992 | Mori | |
| 6,804,125 B2 * | 10/2004 | Brkovic | ........................... 363/17 |
| 6,936,974 B2 * | 8/2005 | Melis | ......................... 315/209 R |

FOREIGN PATENT DOCUMENTS

| DE | 4124747 A1 | 1/1992 |
| DE | 10314514 | 2/2004 |
| DE | 60006744 | 5/2004 |

OTHER PUBLICATIONS

Funkschau-Arbeitsblaetter: Grundshaitungen der Electronik 6—Stromversorgungen. Franzis-Verlag. 1987. S 69-72.

* cited by examiner

*Primary Examiner* — Kenneth B. Wells
(74) *Attorney, Agent, or Firm* — Dicke, Billig & Czaja, PLLC

(57) ABSTRACT

Disclosed is a control circuit for controlling a controllable power semiconductor switch, and to a power semiconductor module. The control circuit comprises at least two circuit sets, each having a power driver. The power driver of each of the circuit sets is provided with power via impedance components having an impedance other than zero.

25 Claims, 15 Drawing Sheets

US 7,969,208 B2

CONTROL CIRCUIT FOR A POWER SEMICONDUCTOR ASSEMBLY AND POWER SEMICONDUCTOR ASSEMBLY

CROSS REFERENCE TO RELATED APPLICATIONS

This Utility Patent Application claims priority to German Patent Application No. DE 10 2008 055 157.0-32, filed on Dec. 23, 2008, and incorporated herein by reference.

FIELD OF TECHNOLOGY

The invention relates to a control circuit for a power semiconductor assembly and to a power semiconductor assembly.

BACKGROUND

Many power semiconductor circuits feature controllable power semiconductor switches connected in parallel to achieve a higher current switching capacity. In other applications, for instance in inverters, motor controllers, etc. the load paths from two controllable power semiconductor switches are connected in series so as to achieve one or more branches ("half bridges") of the circuit, each branch including a high-side switch and a low-side switch. By using such branches, for example, power inverters including a three-phase bridge circuit ("6 pack") or a two-phase bridge circuit ("4 pack") may be created.

Circuits may be designed symmetrically or also asymmetrically, e.g., in which more than one controllable power semiconductor switch are arranged on the low side as is the case e.g., with converters for switched reluctance machines (SRM) or with interleaved two-transistor forward (ITTF) converters.

For controlling each controllable power semiconductor switch a driver is provided which controls each power semiconductor switch involved in turning it ON or OFF. As a whole, the drivers together form a control circuit. Whilst when operating controllable power semiconductor switches high voltages exceeding e.g., 30 V may be dropped over their load paths, controlling controllable power semiconductor switches is done with relatively low voltages. Thus, in the case of a circuit branch in which high-side and low-side switches are connected in series separate power supplies are needed for controlling the high-side switches and low-side switches. Where a plurality of assemblies involving several circuit branches is provided, the emitter and/or the source contacts may be interconnected with a low impedance the same as in a parallel circuit of two or more controllable power semiconductor switches. In these cases a common low voltage source may be employed to supply the drivers of the low-side switches and the drivers of the controllable power semiconductor switches connected in parallel, respectively, since controlling the controllable power semiconductor switches can be done with a low voltage relative to the emitter or source contact of the respective switch. In such an arrangement the common low voltage source is connected to a central point of the power circuit.

This circuit has two serious drawbacks, however.

For one thing, because of voltages induced in parasitic inductances of the low-impedance conductors connecting the emitter or source contacts of the interconnected low-side switches of two or more circuit branches, ON/OFF switching of at least one controllable power semiconductor switch may result in a parasitic ON of one or more of the controllable power semiconductor switches unintentionally when their reference potential is pulled below the reference potential of the corresponding driver.

For another, the negative feedback at least for one of the low-side power switches is increased due to the inductance common to the load circuit (i.e., the power switches) and to the control circuit (i.e., the drivers) leading to increased power-up losses.

Another possibility is to connect the common power supply of the drivers for controlling the low-side switches at several points to the load circuit, in which case parts of the load current flow via redundant connections in the control circuit but which likewise adds to the power-up losses. Problems like this also materialize when operating several controllable power semiconductor switches connected in parallel.

Although, where pairs of branches, each controlled independently of the other, are involved, especially when the switching power required is small, the increase in the power-up losses is acceptable, additional costs materialize since the controllable power semiconductor switches and/or their heat sinks necessitate a larger rating.

And, although, especially where the switching power is higher, several galvanically decoupled power supplies may be put to use, this too adds to the complexity.

In parallel branched circuit assemblies resistances may be inserted in the connection between the driver and an auxiliary contact of the emitter or source contact—where the gate resistances are correspondingly reduced—but to adequately restrict the currents flowing via the auxiliary contact a prohibitively high resistance would be needed. Due to the drop in voltage across such a resistance any lack of symmetry in the switching action of the parallel controllable power semiconductor switches would be amplified and thus such a resistance would have to be restricted to roughly 10% of the gate resistance.

For these and other reasons there is a need for the present invention.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

Figure 1:
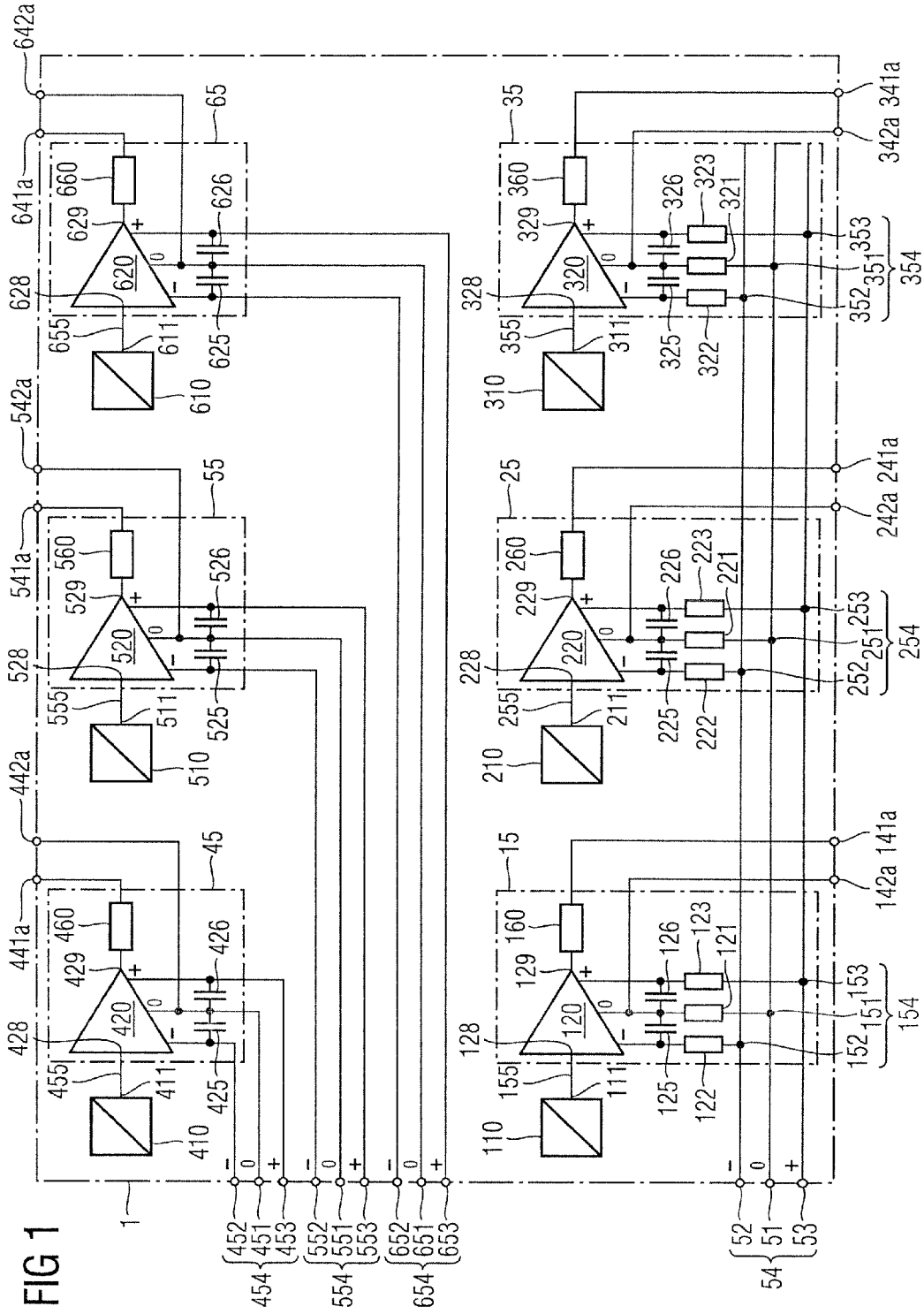
FIG. 1 is a circuit diagram illustrating one embodiment of a control circuit for a three-phase bridge circuit.

In the FIGs. like reference numerals identify like elements having the same or corresponding function. Where as illustrated in the FIGs. a permanent coupling of two components is made, for example, by using tracks, resistances, coils, capacitors, transformers, impedance components or the like any such permanent coupling may also be achieved as a switchable coupling, for example, by inserting a controllable power semiconductor switch. The two components can thus be coupled to each other even though this is not expressly mentioned.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides a low-cost control circuit as well as a power semiconductor assembly including such a control circuit including drivers for controlling the low-side switches of two or more circuit branches or for controlling several controllable power switches electrically connected in parallel as may be powered by a common voltage source and which avoids the drawbacks as discussed above, or at least makes them much less of a problem.

A first embodiment relates to a control circuit including at least two circuit sets. The control circuit includes at least two outputs, each of which being designed to provide a first control signal for controlling a controllable power semiconductor switch. In accordance with the present invention a controllable power switch is achieved by using at least one power semiconductor chip, i.e., a power switch may include either just one single power semiconductor chip or—for instance when the switching capacity needs to be boosted—at least two power semiconductor chips connected in parallel. In the latter case the parallel circuit is designed so that all control contacts are electrically interconnected. In addition, the load paths of the power semiconductor chip are connected in parallel so that they are either all ON or all OFF by using a control signal applied to each of the control contacts.

Each of the at least two circuit sets is assigned to precisely one of the outputs of the control logic and includes an input which is coupled/coupleable to the control logic output assigned to the corresponding circuit set.

Each of the circuit sets includes a dedicated power driver the input of which is electrically coupled/coupleable to the input of the corresponding circuit set. In addition, each of the circuit sets includes a power supply connection set featuring at least two power supply terminals which is electrically coupled/coupleable to the dedicated power driver of the corresponding circuit set to connect the corresponding power driver to a power supply connectable to the power supply connection set concerned. Further, each of the circuit sets includes a signal common output and signal output for controlling a controllable power semiconductor switch.

In this arrangement each of the power supply terminals is coupled/coupleable by using an impedance component to the power driver of the circuit set assigned to the corresponding power supply connection set, and each impedance component includes an impedance other than zero, meaning that at least one of the parameters effective resistance and reactance is other than zero.

In each of the circuit sets a first one of the impedance components of the respective circuit set is connected, on its side facing the power driver of the respective circuit set, directly to the signal common output of the respective circuit set. The other impedance components (i.e., except for the first one) of the respective circuit set is connected, on its side facing the power driver of the respective circuit set, via a capacitor to the signal common output of the respective circuit set.

Further, in each of the circuit sets the power for supplying the complete power driver of the respective circuit set is supplied via the impedance components of the respective circuit set only, i.e., the complete power supply for supplying the respective power driver is provided via the impedance components of the respective circuit set.

The power driver of each circuit set includes a (final) output stage the power supply of which is provided via the impedance components of the respective circuit set.

A second embodiment of the invention relates to a power semiconductor assembly including one such control circuit as well as a number of controllable power semiconductor switches corresponding to the number of circuit sets. Each of these power switches includes a first load contact, a second load contact and a control contact, a load path being configured between each first load contact and second load contact and which may be signaled ON or OFF by using the corresponding control contact. In this arrangement precisely one power semiconductor switch is electrically coupled/coupleable to an output of the power driver of precisely one of the circuit sets.

It is understood by the wording of the present invention that two components are coupled to each other when a signal is communicated from one of the components via one or more coupling members to the other of the components so that the signal logic present in the first component is also present in the other component. Thus, any attenuation of the signal is admissible as long as the communicated logic is reliably transmitted. Any such electric signal may be, for example, a voltage level, a current, a signal edge, a digital signal or an electromagnetic field. Coupling members may be, for example, low impedance links such as conductor tracks, contact pads, bond wires just as well as e.g., resistance elements, amplifier stages or transformers with or without a core.

The wording coupleable is understood to mean that such a coupling is not necessarily permanent but may also be switchable for example by using a controllable semiconductor switch such as e.g., a transistor. In other words, a corresponding controllable semiconductor switch or some other switch may be provided for implementation which is capable of producing a coupling, at least temporarily, Referring now to FIG. 1 there is illustrated one embodiment of a circuit diagram of a control circuit 1 for controlling a three-phase inverter with three half-bridge branches each including a controllable high-side semiconductor switch and a controllable low-side semiconductor switch. Provided for controlling each of these controllable power semiconductor switches is a logic driver 110, 210, 310, 410, 510, 610 each including an output 111, 211, 311, 411, 511 and 611 respectively. Each of these outputs 111, 211, 311, 411, 511 and 611 is coupled to an input 115, 255, 355, 455, 555 and 655 respectively of precisely one circuit set 15, 25, 35, 45, 55 and 65 respectively each of which features a power driver 120, 220, 320, 420, 520 and 620 respectively receiving the output signal of the corresponding logic driver 110, 210, 310, 410, 510, 610 via corresponding inputs 128, 228, 328, 428, 528 and 628 respectively of the corresponding power driver by which it is adapted to the requirements of the control inputs of the power semiconductor switches to be controlled as made available at the output 129, 229, 329, 429, 529 and 629 respectively. The power drivers 120, 220, 320, 420, 520 and 620 respectively may be, for example, current amplifiers, impedance components or voltage amplifiers.

The power drivers 120, 220, 320, 420, 520, 620 furnishing the control current needed to control the controllable power semiconductor switches for connection may be configured, for example, as emitter followers with complementary bipolar transistors or as source followers with complementary MOSFETs featuring a low gate threshold voltage of, for instance, below 3 V, it being just as possible, however, to employ high power CMOS output stages as power drivers 120, 220, 320, 420, 520, 620.

The logic drivers 110, 210, 310 as well as the circuit sets 15, 25, 35 are provided to control the controllable low-side semiconductor switches whilst the logic drivers 410, 510 and 610 and the circuit sets 45, 55 and 65 serve to control the controllable high-side semiconductor switches. To furnish corresponding control signals, connection terminals 141a, 241a, 341a, 441a, 541a and 641a as well as for the corresponding reference potentials connection terminals 142a, 242a, 342a, 442a, 542a and 642a are provided. In addition, between the connection terminals 141a, 241a, 341a, 441a, 541a and 641a and the outputs of the corresponding power amplifiers 120, 220, 320, 420, 520, 620 a resistance 160, 260, 360, 460, 560 and 660 respectively in each case is connected.

To power the circuit sets 15, 25, 35, 45, 55, 65 each of these include a power supply connection set 154, 254, 354, 454, 554, 654. For the circuit sets 15, 25, 35, 45, 55, 65 to be powered by a bipolar voltage the power supply connection modules 154, 254, 354, 454, 554, 654 each include three power supply terminals 151/152/153; 251/252/253, 351/352/353, 451/452/453, 551/552/553 and 651/652/653 respectively of which each include a first 151, 251, 351, 451, 551 and 651 respectively for connecting a reference potential, a second 152, 252, 352, 452, 552 and 652 respectively for connecting a negative potential relative to the reference potential and a third 153, 253, 353, 453, 553 and 653 respectively for connecting a positive potential relative to the reference potential.

When the power drivers 120, 220, 320 provided for controlling the low-side switches are to be powered by a common voltage source each power supply terminal 151, 152, 153 of a power supply connection set 154 is electrically connected to a corresponding power supply terminal 251/351, 252/352 and 253/353 respectively of each of the other power supply connection sets 154, 254, 354 and optionally together therewith joined to common power supply terminals 51, 52 and 53 respectively of a common power supply connection set 54.

Furthermore, each of the power supply terminals 151, 152, 153; 251, 252, 253; 351, 352, 353 of the power supply connection sets 154, 254 and 354 respectively provided to power the power drivers 120, 220, 320 for controlling the low-side switches is connected to the corresponding power driver 120, 220, 320 by using an impedance component 121, 122, 123; 221, 222, 223; 321, 322, 323. Each of the impedance components 121, 122, 123; 221, 222, 223; 321, 322, 323 includes an impedance $Z=R+j\cdot X$ other than zero with an effective resistance R and/or a reactance X where j is the imaginary unit, meaning that at least one of the parameters effective resistance R and reactance X is other than zero.

Because of the power drivers 120, 220, 320 provided for controlling the low-side switches and the impedance components provided for furnishing the power the impedances needed for decoupling in conventional assemblies are to be found in the control contact circuit of the controllable low-side switches to be controlled are shifted from the control contact circuits of the low-side switches into the power supply of each power driver 120, 220, 320 since the currents flowing here are smaller by one to two magnitudes than the currents in the control contact circuits. It is in this way that an unwanted current flow from the power circuit into the power supply of the drivers control the power semiconductor switches is prevented or at least reduced to an acceptable degree.

Figure 2:
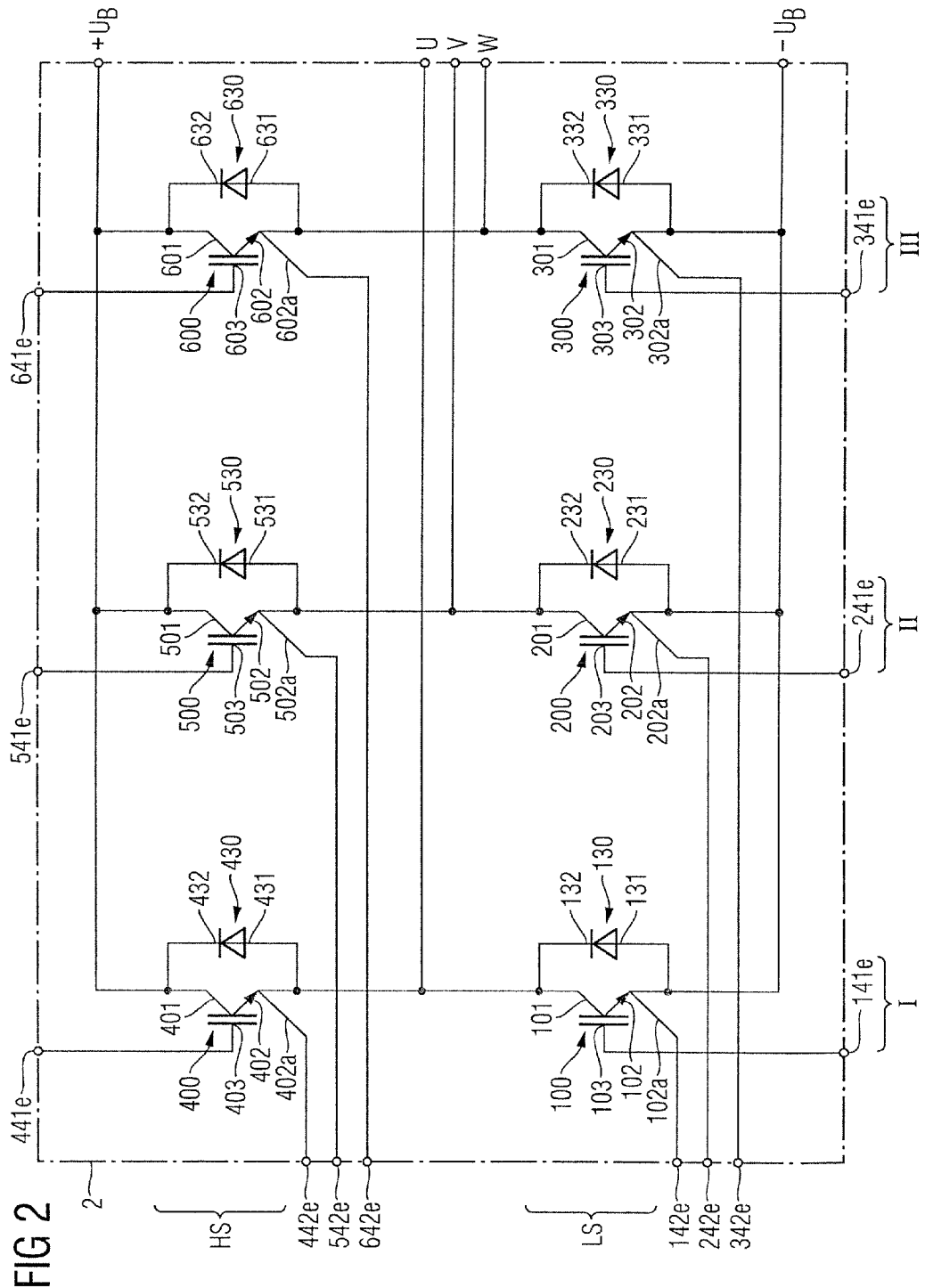
FIG. 2 is a circuit diagram illustrating one embodiment of the power section of a power semiconductor module including a three-phase bridge circuit which is controllable by using a control circuit as shown in FIG. 1.

The magnitude of the impedance of a single, several or each of the impedance component(s) 121, 122, 123; 221, 222, 223; 321, 322, 323 of a circuit sets 15, 25 and 35 respectively or of the impedance components 121, 122, 123; 221, 222, 223; 321, 322, 323 of the control circuit 1 may be selected, for example, greater than 0.3 times the gate resistance of the control contact (e.g., the gate resistance of the controllable power semiconductor switch—see in FIG. 2 for example the controllable power semiconductor switches 100, 200, 300) which is controlled by the circuit sets 15, 25, 35 to which the corresponding impedance components 121, 122, 123; 221, 222, 223; 321, 322, 323 belongs. In the case of a frequency-dependent impedance component 121, 122, 123; 221, 222, 223; 321, 322, 323 the magnitude of its impedance is to be established at the frequency at which the current through the output 129, 229 and 329 respectively of the power driver 120, 220, 320 of the corresponding circuit set 15, 25 and 35 respectively features in magnitude its greatest amplitude in its Fourier spectrum when the input 128, 228 and 328 respectively (see FIG. 1) of the corresponding power driver 120, 220 and 320 respectively is controlled by a square-wave control voltage.

It is understood in the wording of the present embodiment that the gate resistance of a controllable power semiconductor switch of a power semiconductor module is the electric resistance presented by the conductor connecting the output 129, 229, 329, 429, 529 and 629 respectively of a power driver 120, 220, 320, 420, 520 and 620 respectively up to the control contact of the semiconductor chip by using which the controllable power semiconductor switch is achieved as is controlled with the corresponding output 129, 229, 329, 429, 529 and 629 respectively.

In case the controllable power semiconductor switch is achieved by two or more power semiconductor chips connected in parallel such an electric resistance may be defined starting with the output 129, 229, 329, 429, 529 and 629 respectively of the power driver 120, 220, 320, 420, 520 and 620 respectively for each of the power semiconductor chips connected in parallel separate, as the gate resistance of the complete power semiconductor switch formed by the power semiconductor chips connected in parallel then being understood as the electric resistance resulting from electrically circuiting in parallel these separate electrical resistances.

It is understood in the wording of the present embodiment that an impedance component 121, 122, 123; 221, 222, 223; 321, 322, 323 is a discrete or integrated component which to make its electric contact may feature, for example, wire ends, solder pads, contact pads or SMD contacts so that it may be connected, for example, by using a conductor pattern of a substrate to the corresponding power driver 120, 220, 320 and to the corresponding power supply terminals 151, 152, 153; 251, 252, 253; 351, 352, 353. An impedance component is, in addition, also understood to be a circuit of two or more such discrete and/or integrated components.

As impedance components 121, 122, 123; 221, 222, 223; 321, 322, 323 use may be made for example of ohmic resistances, coils with or without core, common chokes or circuitry incorporating at least two of these components. It is understood in the wording of the present invention that an impedance component 121, 122, 123; 221, 222, 223; 321, 322, 323 thus differs from a track, bond wire, contact platelet, contact wire, a lead or circuitry exclusively incorporating two or more such elements.

Unlike the power supply terminals 151, 152, 153; 251, 252, 253; 351, 352, 353 for powering the power drivers 120, 220, 320 for controlling the controllable low-side switches the power supply terminals 451, 452, 453, 551, 552, 553, 651, 652 and 653 respectively are connected as low impedances to the corresponding power drivers 420, 520, 620 provided to power the control of the controllable high-side switches. As an alternative it is, of course, just as possible that here too, impedance components 121, 122, 123; 221, 222, 223; 321, 322, 323 are disposed between the power supply terminals 451, 452, 453, 551, 552, 553, 651, 652 and 653 respectively and the corresponding power drivers 420, 520 and 620 respectively.

To buffer the voltages for powering the power drivers 120, 220, 320, 420, 520, 620 via the corresponding power supply connection sets 154, 254, 354, 454, 554 and 654 respectively there are also provided buffer capacitors 125, 126; 225, 226; 325, 326; 425, 426; 525, 526; 625, 626 connected for each of the power drivers 120, 220, 320, 420, 520, 620 between the reference point input (identified by "0" below the power driver 120, 220, 320, 420, 520, 620) and each other power supply input (identified by "−" and "+" below the power drivers 120, 220, 320) of the same power driver 120, 220, 320, 420, 520, 620. In this arrangement the buffer capacitors 125, 126; 225, 226; 325, 326; 425, 426; 525, 526; 625, 626 are connected as near as possible to each of the power drivers 120, 220, 320, 420, 520, 620.

In the circuit sets 15, 25, 35 provided for controlling the controllable low-side semiconductor switches the buffer capacitors 125, 126; 225, 226; 325, 326 are connected between the contacts of the corresponding impedance components 121, 122, 123; 221, 222, 223; 321, 322, 323 connected to associate with the corresponding power drivers 120, 220, 320.

In such a control circuit 1 a power semiconductor module 2 may be controlled, for instance, whose circuit diagram is as illustrated in FIG. 2. The power semiconductor module 2 includes three half-bridge branches I, II and III, each including a high-side circuit branch HS and a low-side circuit branch LS. Each high-side circuit branch of the half-bridge branches I, II and III contains one of the power semiconductor switches 400, 500, 600 respectively, each of the low-side circuit branches contains one of the controllable power semiconductor switches 100, 200, 300. As already explained above, each of the controllable power semiconductor switches 100, 200, 300, 400, 500, 600 may be achieved by using one or more semiconductor chips connected in parallel.

The controllable power semiconductor switches 100, 200, 300, 400, 500, 600 each include a first load contact 101, 201, 301, 401, 501 and 601 respectively, a second load contact 102, 202, 302, 402, 502 and 602 respectively, a control contact 103, 203, 303, 403, 503 and 603 respectively as well as an auxiliary contact 102a, 202a, 302a, 402a, 502a and 602a respectively of the second load contact 102, 202, 302, 402, 502 and 602 respectively. Configured between the first load contact 101, 201, 301, 401, 501 and 601 respectively and the second load contact 102, 202, 302, 402, 502 and 602 respectively of each controllable power semiconductor switch 100, 200, 300, 400, 500, 600 is a load path which may be switched ON/OFF or OFF/ON by using the control signal supplied to the corresponding controllable power semiconductor switch 100, 200, 300, 400, 500, 600, one each of the control contacts 103, 203, 303, 403, 503 and 603 respectively along with one of the auxiliary contacts 102a, 202a, 302a, 402a, 502a and 602a respectively serving to connect the control signals. In each of the half-bridge branches I, II and III the load paths of the corresponding high-side switch 400, 500, 600 and the corresponding low-side switch 100, 200, 300 are connected in series.

In the present embodiment the controllable power semiconductor switches 100, 200, 300, 400, 500, 600, are configured, for example, as IGBTs in which the reference potential for controlling the control contacts 103, 203, 303, 403, 503 and 603 respectively configured as control contacts materializes from the corresponding potential of the second load contact 102, 202, 302, 402, 502 and 602 respectively configured as the emitter contact and is picked off by using an auxiliary contact 102a, 202a, 302a, 402a, 502a and 602a respectively connected thereto. These auxiliary contacts prevent a shift in the voltage implemented by the controllable power semiconductor switch 100, 200, 300, 400, 500, 600 as resulting from a flow of current through a contact lead of the second load contact 102, 202, 302, 402, 502 and 602 respectively.

The power semiconductor module 2 includes +UB and −UB provided to supply the module with a voltage to be switched as dropped across each of the half-bridge branches I, II and III. In normal switching operation the controllable power semiconductor switches 100, 200, 300, 400, 500, 600 are controlled so that the load paths of the high-side switches 400, 500, 600 and the load paths of the low-side switches 100, 200, 300 within a half-bridge branch I, II and III are not simultaneously ON. Otherwise short circuits would occur which are generally unwanted and with time would ruin the controllable power semiconductor switches 100, 200, 300, 400, 500, 600 involved. But in certain applications fleeting short-circuits may be intentionally instigated.

If in a half-bridge branch I, II and III the load path of the high-side switch 400, 500, 600 is ON and the load path of the corresponding low-side switch 100, 200, 300 is OFF a potential applied to the +UB power supply terminal—except for a relatively minor drop in voltage across the corresponding load path and the associated connecting leads—is switched to an output U, V or W of the power semiconductor module 2 electrically conductively connected to both the second load contact 402, 502 and 602 respectively of the high-side switch 400, 500, 600 and to the first load contact 101, 201, 301 of the low-side switch 100, 200, 300 of the corresponding half-bridge branch I, II and III.

If, conversely, the load path of the high-side switch 400, 500, 600 is OFF and the load path of the associated low-side switch 100, 200, 300 is ON the potential as applied to the other power supply terminal −UB is switched to an output U, V or W—except for a relatively minor drop in voltage across the corresponding load path and the associated connecting leads.

Each of the controllable power semiconductor switches 100, 200, 300, 400, 500 and 600 respectively features optionally a free-wheeling diode 130, 230, 330, 430, 530 and 630 respectively connected antiparallel to the load path, the cathodes 132, 232, 332, 432, 532 and 632 respectively of which are electrically conductively connected to each first load contact 101, 201, 301, 401, 501 and 601 respectively and the anodes 131, 231, 331, 431, 531 and 631 respectively of which are each electrically conductively connected to each second load contact 102, 202, 302, 402, 502 and 602 respectively.

In addition, the power semiconductor module 2 includes optional contacts 141e, 241e, 341e, 441e, 541e, 641e, 142e, 242e, 342e, 442e, 542e, 642e which the same as the contacts U, V, W, +UB, −UB are configured for example as screw, clamp, crimp, connector or like type of contact and which, when needed may be brought out from a casing of the module 2.

Figure 3:
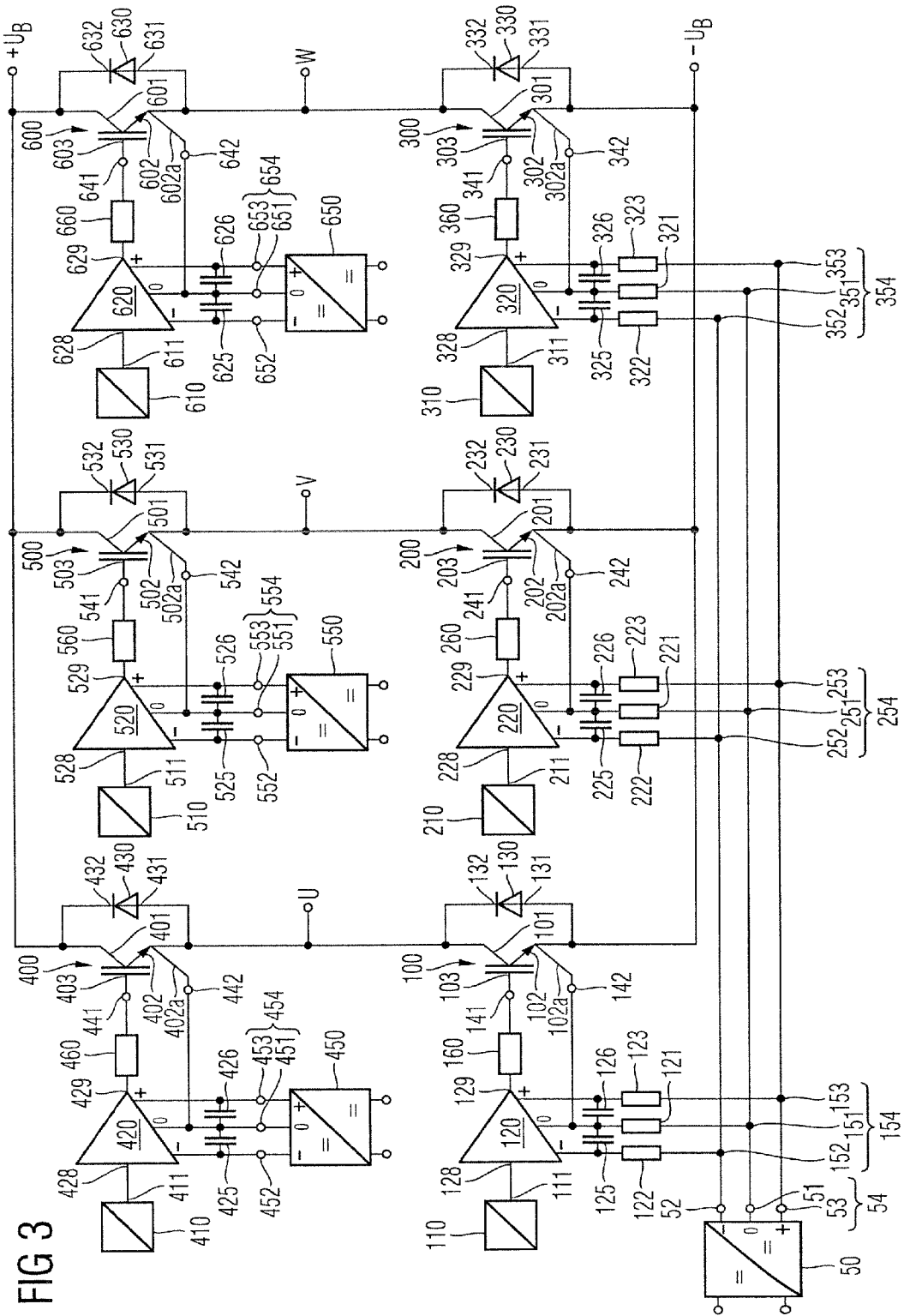
FIG. 3 is a circuit diagram illustrating one embodiment of the power section as illustrated in FIG. 2, here connected to a control circuit as illustrated in FIG. 1 powered by several power supply voltages.

Referring now to FIG. 3 there is illustrated a circuit diagram of the power section as illustrated in FIG. 2 connected to the control circuit as illustrated in FIG. 1 for which purpose the inputs 141e, 241e, 341e, 441e, 541e, 641e, 142e, 242e, 342e, 442e, 542e, 642e (see FIG. 2) are connected at junctions 141, 241, 341, 441, 541, 641, 142, 242, 342, 442, 542 and 642 respectively to the outputs 141a, 241a, 341a, 441a, 541a, 641a, 142a, 242a, 342a, 442a, 542a and 642a respectively (see FIG. 1).

Provided furthermore are several bipolar voltage sources 50, 450, 550, 650 to power the control circuit providing the bipolar power supply voltages, for example, each +16V, 0 V and −8 V. The voltage sources 50, 450, 550, 650 may be achieved, for example, as DC/DC converters, the voltage source 50 then connecting the power supply connection set 54 in powering all power drivers 120, 220, 320 for controlling the controllable low-side switches 100, 200, 300, whereas a separate voltage source 450, 550 and 650 respectively is provided for powering each power driver 420, 520, 620 provided for controlling the high-side switches 400, 500, 600 connecting the corresponding power supply connection sets 454, 554 and 654 respectively.

Figure 4:
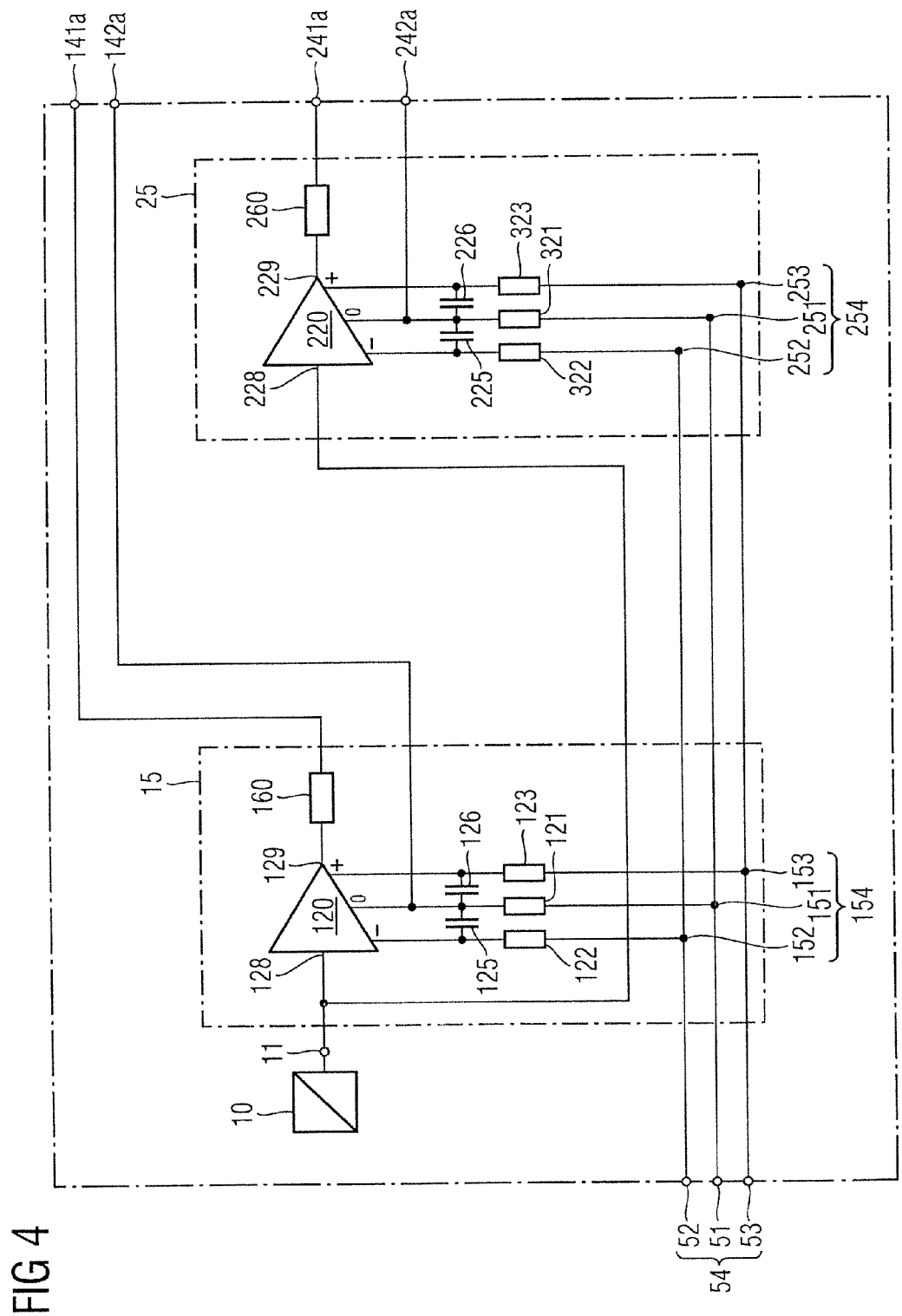
FIG. 4 is a circuit diagram illustrating one embodiment of a control circuit for two controllable power semiconductor switches connected in parallel.

Referring now to FIG. 4 there is illustrated a further example of a control circuit for controlling two controllable power switches whose load paths are electrically connected in parallel to boost the currents to be switched. For instance, the power switches connected in parallel have a common mode switching action, i.e., their load paths are either all simultaneously ON or OFF. This is why one common logic driver 10 is sufficient for controlling all power switches connected in parallel.

However, here too, a separate power driver 120, 220 is provided for controlling each power switch having load paths connected in parallel to be controlled. The inputs of these power drivers 120, 220 are connected to an output 11 of the common logic driver 10. Powering the power drivers 120, 220 may be done just the same as already described with reference to FIGS. 1 to 3, especially as regards the possibility of a common power supply for the power drivers 120, 220 of all power switches to be controlled having load paths connected in parallel via a common power supply connection set 54 as well as for providing impedance components 121, 122, 123; 221, 222, 223 in each of the lines connecting the power supply to these power switches and for the possible configurations of such impedance components 121, 122, 123; 221, 222, 223.

Figure 5:
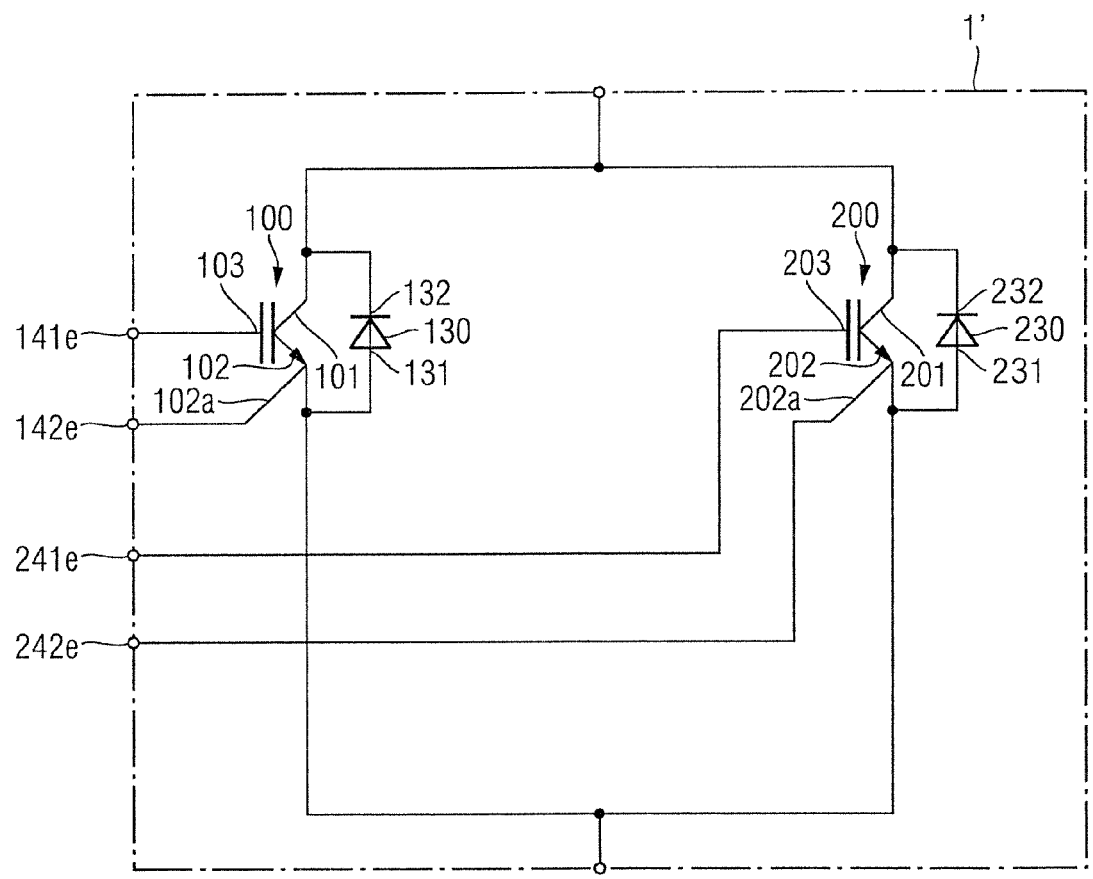
FIG. 5 is a circuit diagram illustrating one embodiment of the power section of a power semiconductor module including two controllable power switches connected in parallel which is controllable by using a control circuit as illustrated in FIG. 4.

Referring now to FIG. 5 there is illustrated a circuit diagram of the power section of a power semiconductor module 1' including two controllable power switches connected in parallel. One such power semiconductor module may be controlled by using the control circuit as explained above with reference to FIG. 4. The power semiconductor module 1' includes two controllable power semiconductor switches 100, 200 which may be configured just the same as the controllable power semiconductor switches 100, 200 already explained with reference to FIGS. 1 and 3. Connecting in parallel the load paths of the two controllable power semiconductor switches 100, 200 is achieved by interconnecting their first load contacts 101 and 201 and their second load contacts 102 and 202.

Figure 6:
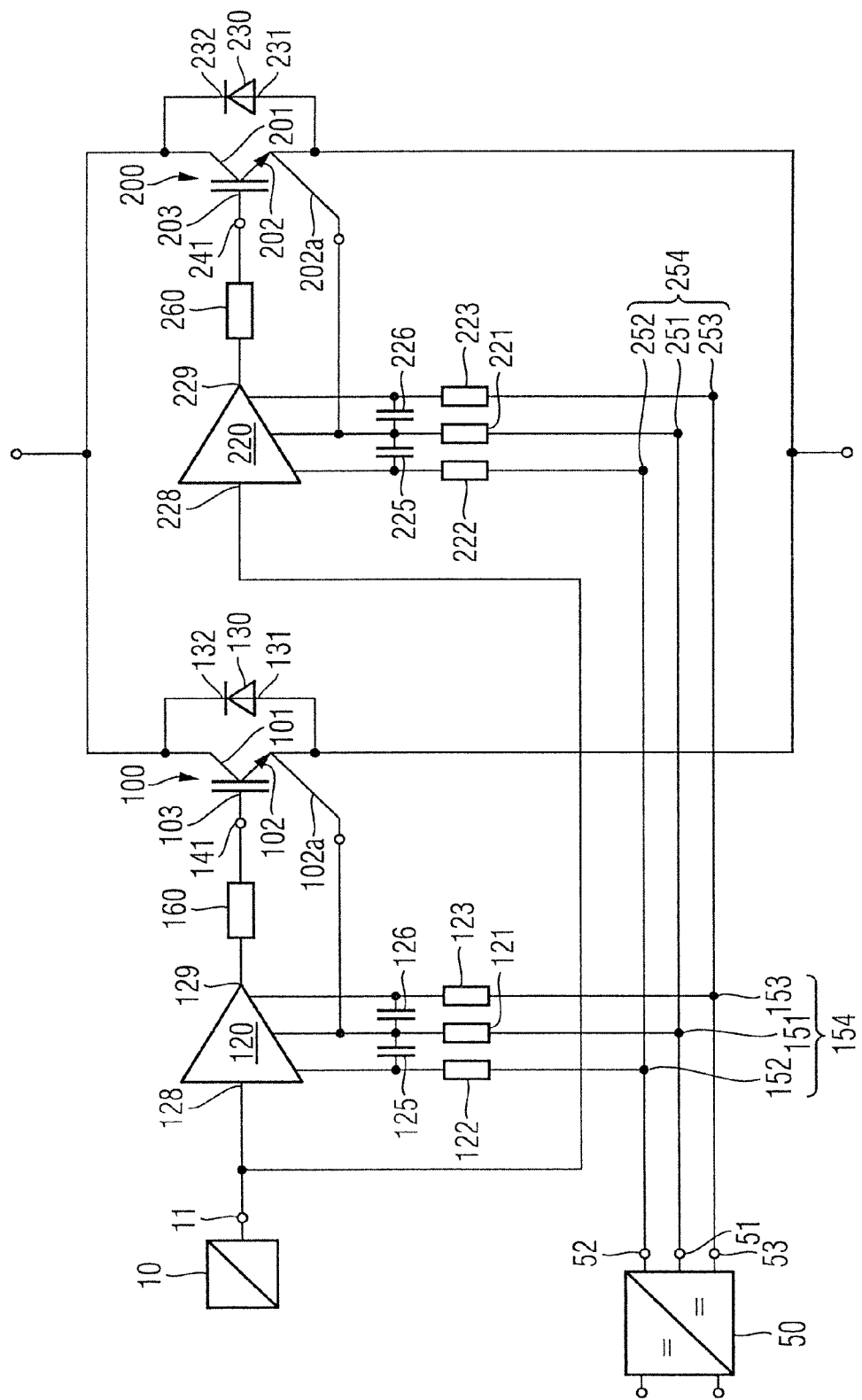
FIG. 6 is a circuit diagram illustrating one embodiment of the power section as illustrated in FIG. 5 connected to a control circuit as illustrated in FIG. 1 powered by a common power supply voltage.

Referring now to FIG. 6 there is illustrated a circuit diagram of the power section as shown in FIG. 5 connected to the control circuit as shown in FIG. 4 wherein the inputs 141e, 241e, 142e, 242e (see FIG. 5) are connected at the junctions 141 and 241 respectively to the outputs 141a and 241a, respectively (see FIG. 1). Provided in addition is a bipolar voltage source 50 for powering the power drivers 120, 220 of the power semiconductor chips 100 and 200 respectively connected in parallel.

It is understood in the wording of the present invention that all of the control circuits as described above allow for signal transfer from a logic driver 110, 210, 310, 410, 510, 610 and 10 to the corresponding downstream power driver(s) 120, 220, 320, 420, 520, 620 and 120/220 respectively by DC decoupling the corresponding control signal as integrated in the corresponding power driver which is directly connected to the auxiliary contact 102a, 202a, 302a, 402a, 502a and 602a respectively of the power semiconductor switch(es) 100, 200, 300, 400, 500, 600 to be controlled using only low-impedance connections.

It is likewise possible to employ level shifters for signal transfer from a logic driver 110, 210, 310, 410, 510, 610 and 10 to the corresponding downstream power driver 120, 220, 320, 420, 520, 620 and 120/220.

In addition, controlling the power drivers 120, 220, 320, 420, 520, 620 and 120/220 can also be done by using a signal having a steep slope and an amplitude greater than the amplitude needed at the control contact 103, 203, 303, 403, 503 and 603 respectively for switching the power semiconductor switches 100, 200, 300, 400, 500, 600 to be controlled so that the point of time in switching is not detrimented by the effect of any dynamic shifts in the reference potential of the controllable power semiconductor switches 100, 200, 300, 400, 500, 600 to be controlled.

The controllable power semiconductor switches 100, 200, 300, 400, 500, 600 as used in the examples as described above are devised to switch currents as high as 200 A, for instance, and voltages as high as 1200 V, for example. As shown, they may be configured as IGBTs, although it is just as possible that MOSFETs, thyristors, bipolar transistors, junction FETs or cascode combinations of MOSFETs and junction FETs may be employed in any combination.

In a control circuit 2 incorporating several logic drivers 110, 210, 310, 410, 510, 610 (see FIGS. 1 and 3) two, more or all logic drivers 110, 210, 310, 410, 510, 610 may be integrated in a common driver module. Such driver modules may also handle other additional functions such as, e.g., detecting short circuits, monitoring temperatures, sensing desaturation of a voltage drop across the load path (VCEsat sensing), a safe OFF function when an error occurs, or the like.

Figure 7:
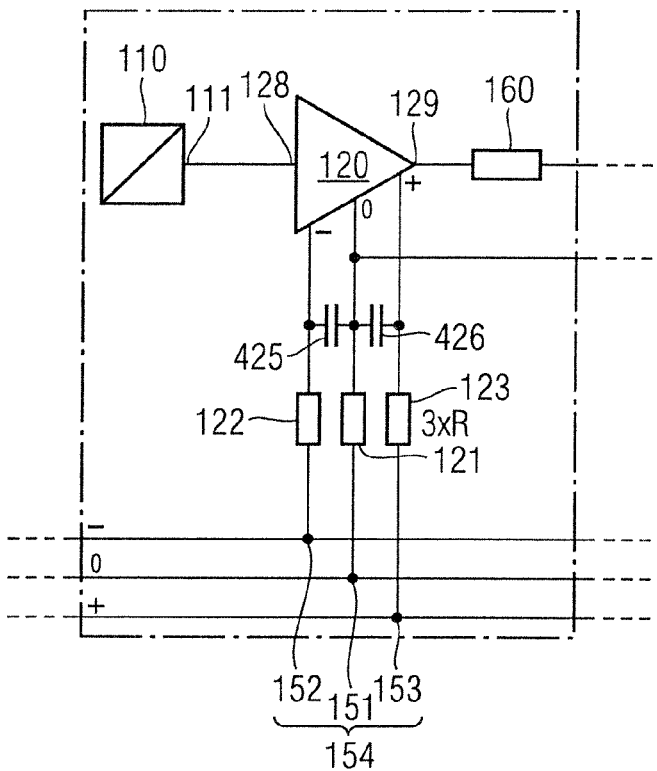
FIG. 7 illustrates one embodiment of a detail of the circuit diagram of a control circuit as illustrated in FIG. 1 in which the impedance components are configured as electrical resistances.

Referring now to FIG. 7 there is illustrated how the embodiment of a section of the control circuit as depicted in FIG. 1 illustrates that the impedance components 121, 122, 123 may be configured in the power supply feeders for the power driver 120 as one such electrical resistance R.

Figure 8:
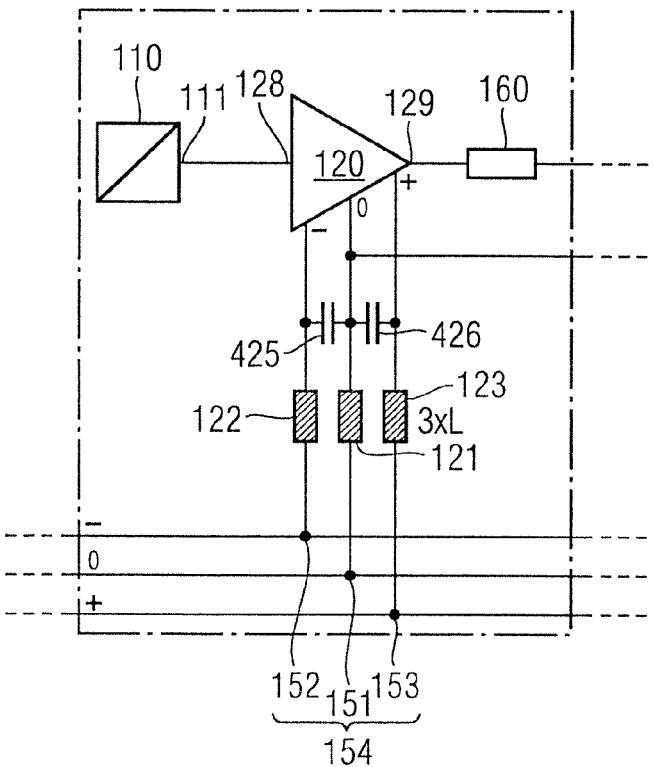
FIG. 8 illustrates one embodiment of a detail of the circuit diagram of a control circuit as illustrated in FIG. 1 in which the impedance components are configured as inductances.

Referring now to FIG. 8 there is illustrated how instead of an effective resistance R the impedance components 121, 122, 123 may also be each configured as inductances L by way of the example of the power supply of the power driver 120 as illustrated in FIG. 1.

Figure 9:
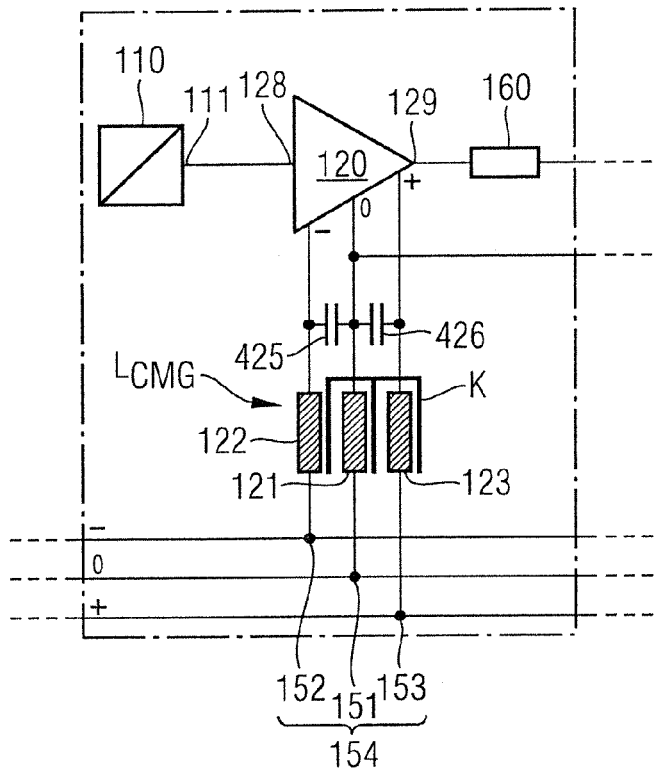
FIG. 9 illustrates one embodiment of a detail of the circuit diagram of a control circuit as illustrated in FIG. 8 with the difference that coil windings instead of inductances are provided, the coil windings being wound on a common core and forming together therewith a common mode choke.

Referring now to FIG. 9 there is illustrated how the inductances L in each power supply line may also be configured as windings on a common core K forming together with the coil core K a common mode choke LCMC.

In actual practice, effective resistance components R, as shown in FIG. 7, also include an inductance, albeit small. Conversely real inductances L or LCMC as shown in FIGS. 8 and 9 also include an effective resistance, again albeit small.

The type and optionally also the dimensioning of the impedance components 121, 122, 123; 221, 222, 223; 321, 322, 323 may be selected identical, as also evident by way of example with reference to the FIGs. as discussed above, within one, several or all circuit sets 15, 25, 35, 45, 55 and 65 respectively of the control circuit 1. Each and every one of the impedance components 121, 122, 123; 221, 222, 223; 321, 322, 323 may be basically configured and dimensioned independently of the other.

Figure 10:
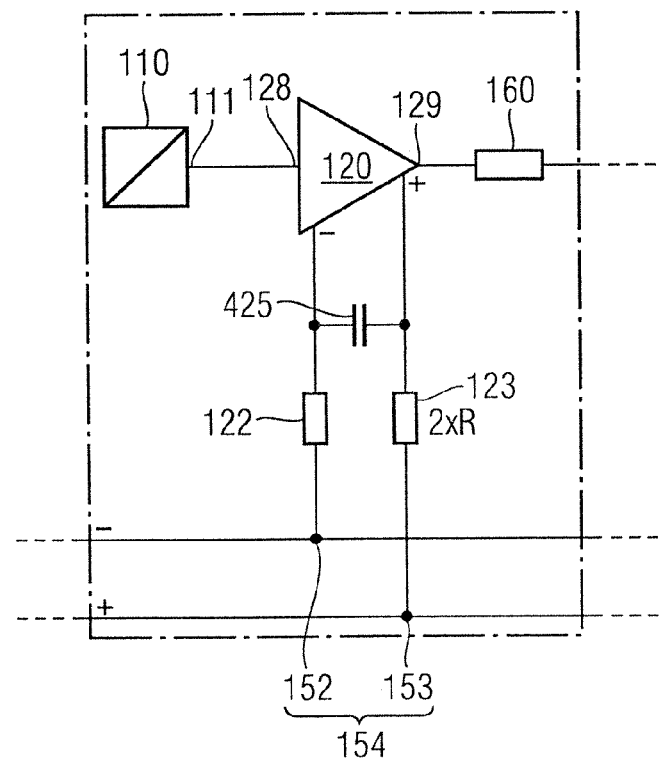
FIG. 10 illustrates one embodiment of a detail of the circuit diagram of a control circuit as illustrated in FIG. 1 in which impedance components are configured as electrical resistances with the difference that the control circuit as regards the power supply of the power driver is configured for connecting a unipolar instead of a bipolar voltage source.
Figure 11:
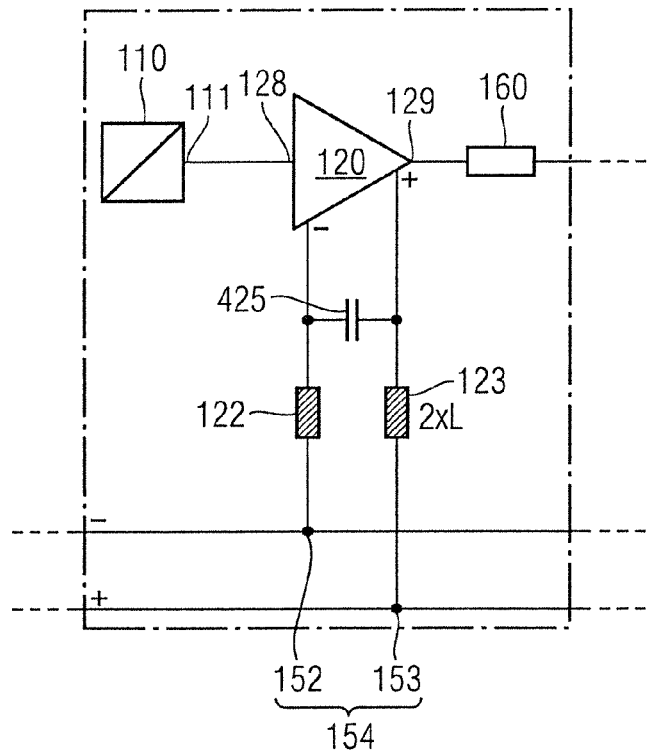
FIG. 11 illustrates one embodiment of a detail of the circuit diagram of a control circuit as illustrated in FIG. 10 with the difference that the impedance components are configured as inductances.
Figure 12:
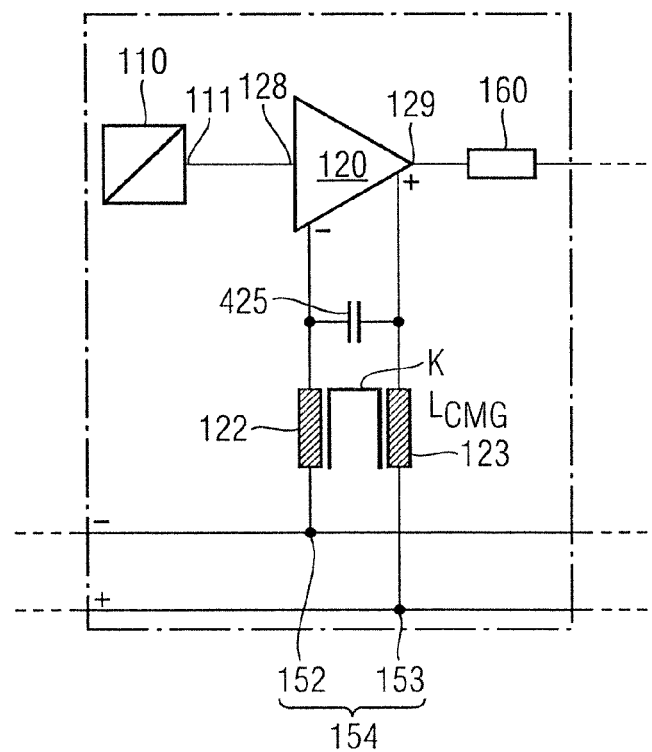
FIG. 12 illustrates one embodiment of a detail of the circuit diagram of a control circuit as illustrated in FIG. 11 with the difference that coil windings instead of inductances are provided, the coil windings being wound on a common core and forming together therewith a common mode choke.

Referring now to FIGS. 10 to 12 there is illustrated how, whilst the control circuit as illustrated in FIG. 1 is configured for connecting a bipolar power supply of the power drivers 120, 220, 320, 420, 520 and 620 respectively it is basically possible to also provide a unipolar power supply as is shown by way of the power driver 120 as an example. Because of the unipolar power supply, two power supply terminals 152 and 153 as well as two impedance components 122 and 123 are sufficient for the power supply connection set 154. Correspondingly, connecting the at least one buffer capacitor 425 is made between the contacts of the impedance components 122 connected facing the power driver 120.

The assemblies as illustrated in FIGS. 10, 11 and 12 differ in that the impedance components 122 and 123 are configured in FIG. 10 e.g., as ohmic resistances, in FIG. 11 as inductances L and in FIG. 12 as windings of a common mode choke LCMC on a common core K.

Connecting an asymmetric power supply to the control circuit 1 may be provided not only for the power driver 120 but correspondingly also for the power drivers 220, 320, 420, 520 and 620 as shown in FIGS. 1, 3, 4 and 6, it also being basically possible to make the connection to a bipolar power supply for single power drivers of a control circuit 1 and to a unipolar power supply for others. However, the power drivers 120, 220, 320 as illustrated in FIGS. 1 and 3 for controlling controllable low-side switches 100, 200 and 300 respectively as illustrated in FIGS. 2 and 3 are uniformly powered by either a bipolar or an asymmetric power supply, this applying correspondingly too, for powering the power drivers 120, 220 as shown in FIGS. 4 and 6 for controlling controllable power semiconductor switches 100 and 200 respectively as shown in FIGS. 5 and 6 whose load paths are electrically connected in parallel.

Figure 13:
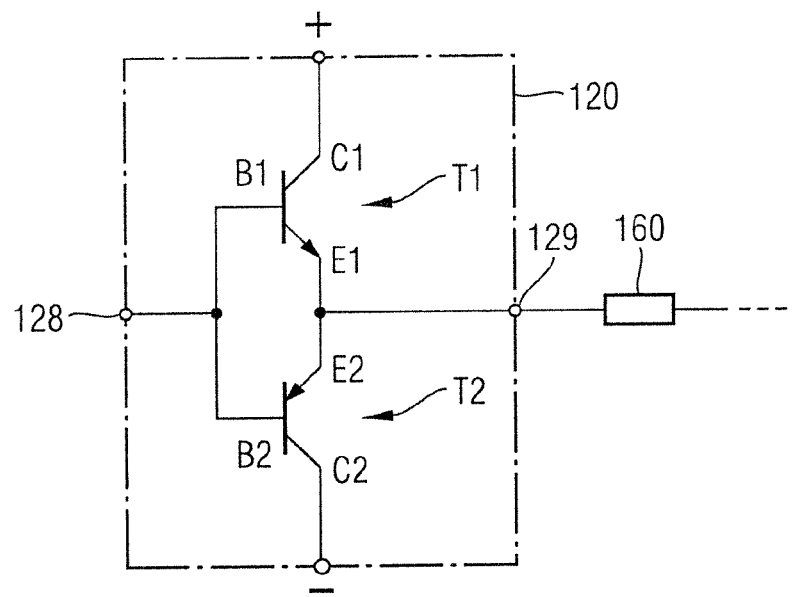
FIG. 13 is a circuit diagram illustrating one embodiment of a power driver configured as an emitter follower with complementary bipolar transistors.

Referring now to FIG. 13 there is illustrated how the power drivers employed for controlling the controllable power semiconductor switches may be configured, for example, as emitter followers with complementary bipolar transistors T1, T2 as an example of a power driver 120 which includes an npn transistor T1 including an emitter E1, a collector C1 and a base B1 as well as, complementary to the npn transistor T1, a pnp transistor T2 including an emitter E2, a collector C2 and a base 2. The input 128 of the power driver 120 is coupled to the bases B1 and B2, the output 129 to the emitters E1 and E2. The collector C1 is provided for connecting a positive power supply voltage, collector C2 for connecting a negative power supply voltage.

Figure 14:
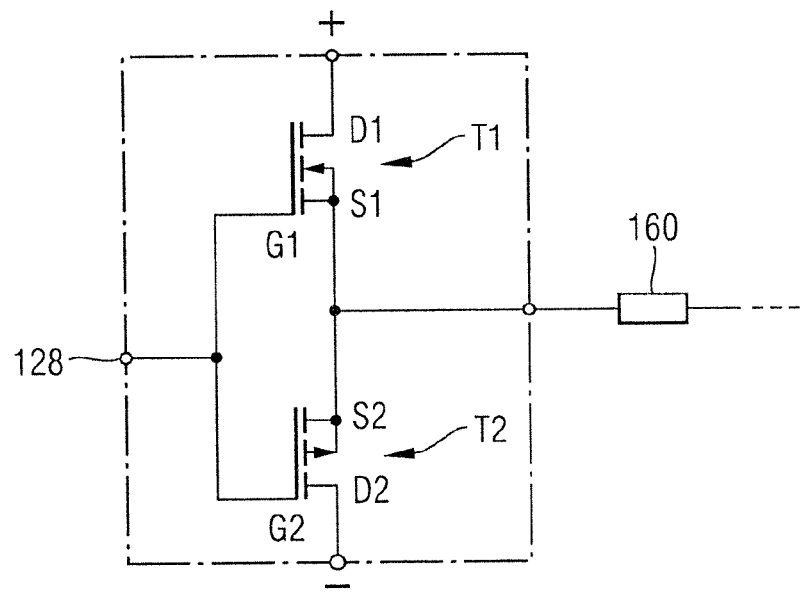
FIG. 14 is a circuit diagram illustrating one embodiment of a power driver configured as a complementary source follower.

Referring now to FIG. 14 there is illustrated an example for another possible configuration of a power driver. In this assembly configured as a complementary source follower the power driver 120 includes an N-channel MOSFET T1 with a drain contact D1, a source contact S1 and a gate contact G1 as well as complementary to the N-channel MOSFET T1 a P-channel MOSFET T2 with a source contact S2, a drain contact D2 and a gate contact G2. The input 128 of the power driver 120 is coupled to the gate contacts G1 and G2, the output 129 to the source contacts S1 and S2. The drain contact D1 is provided for connecting a positive power supply voltage, the drain contact D2 for connecting a negative power supply voltage.

Figure 15:
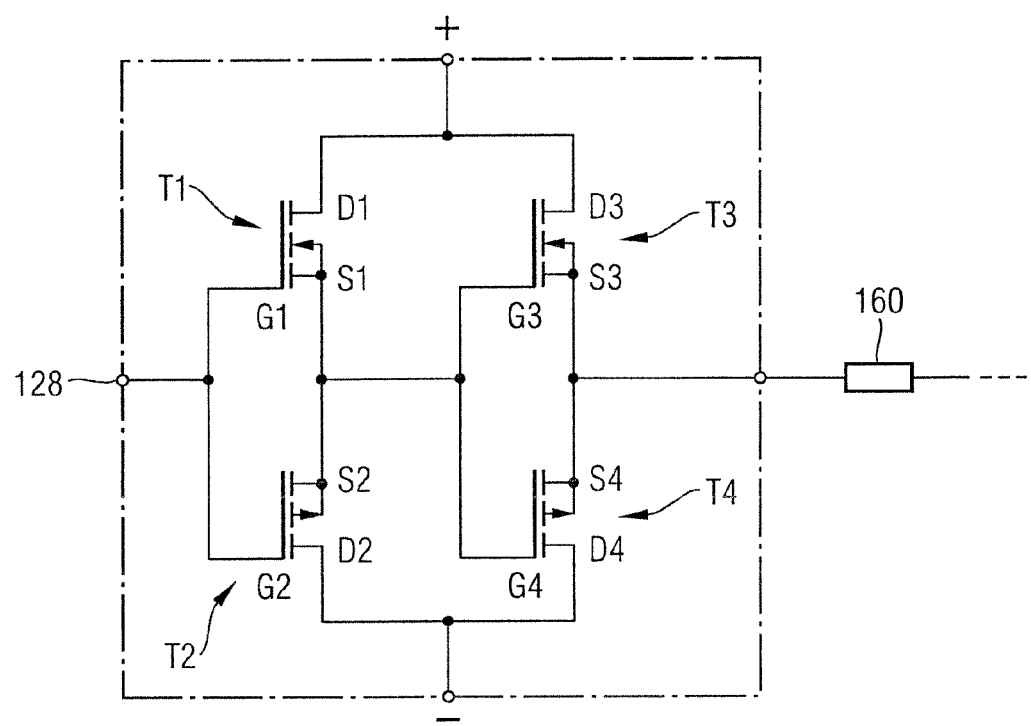
FIG. 15 is a circuit diagram illustrating one embodiment of a power driver configured as a non-inverting CMOS power stage.

Referring now to FIG. 15 there is illustrated yet another example of how a power driver may be configured in making use of two CMOS inverter stages as a non-inverting power output stage.

As exemplified with reference to FIGS. 13 to 15 in connection with FIGS. 1, 3, 4, 6 to 12, 20 and 21, in particular the power supply of the output stage of each of the power drivers 120 (and, accordingly, 220, 320) is provided via the impedance components 121/122/123, 221/222/223 or 321/322/323 of the respective circuit set 15, 25, 35.

Figure 16:
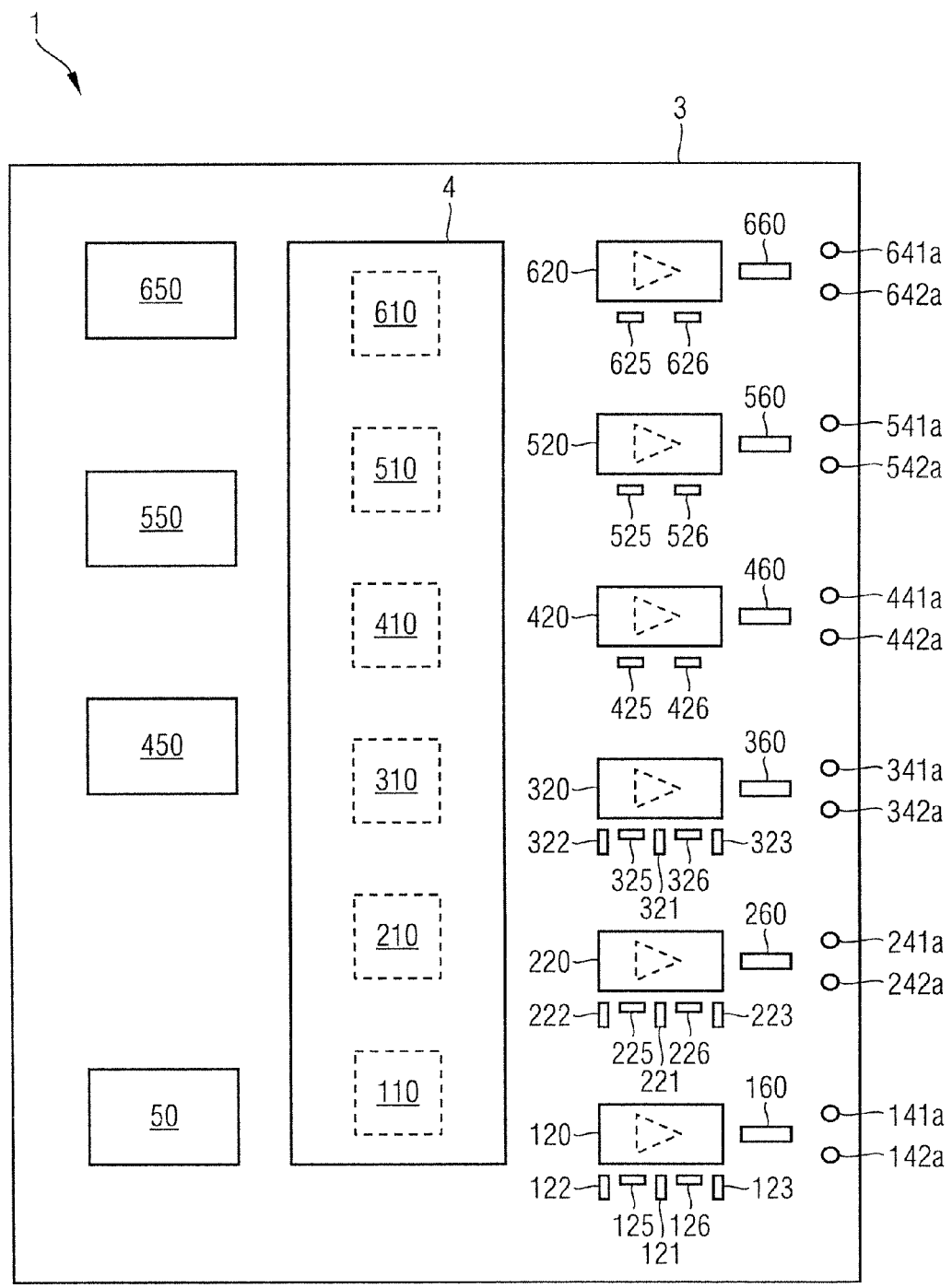
FIG. 16 is a top-down view of a substrate illustrating one embodiment including a control circuit as illustrated in FIG. 1.

Referring now to FIG. 16 there is illustrated how the control circuit 1, as explained by way of example with reference to FIGS. 1 and 4, may be configured e.g., on a substrate 3 which may be, for example, a conventional PCB just as well as e.g., a track patterned ceramic platelet. Although the patterned tracks are not evident from that as illustrated in FIG. 16 to avoid a cluttered illustration, they nevertheless exist in achieving fully or in part the circuiting of the components of the control circuit arranged on the substrate 3. In addition, bond wires, ribbon cables, jumpers or any other suitable wiring components may also be employed.

The components arranged on the substrate 3 as shown in FIG. 16 serve to achieve a control circuit 1 as illustrated in FIG. 1, the substrate 3 mounting the logic drivers 110, 210, 310, 410, 510 and 610 which may be integrated, for example, in a common control circuit 4, for instance an IC. Arranged furthermore on the substrate 3 are the power drivers 120, 220, 320, 420, 520 and 620 directly adjoining the corresponding buffer capacitors 125, 126, 225, 226, 325, 326, 425, 426, 525, 526, 625 and 626 respectively and the resistances 160, 260, 360, 460, 560 and 660 respectively. For the power drivers 110, 210, 310 provided to control the controllable low-side switches the corresponding impedance components 121, 122, 123; 221, 222, 223; 321, 322 and 323 respectively are also arranged on the substrate 3, in addition to which the voltage sources 450, 550, 650 for powering the power drivers 420, 520 and 620 provided for controlling the high-side switches along with the voltage source 50 for the common power supply of the power drivers 120, 220, 320 provided to control the low-side switches.

It is understood that not all of the components as illustrated in FIG. 16 must necessarily be arranged on the substrate 3, but instead certain components may be mounted, for example, on another substrate.

Figure 17:
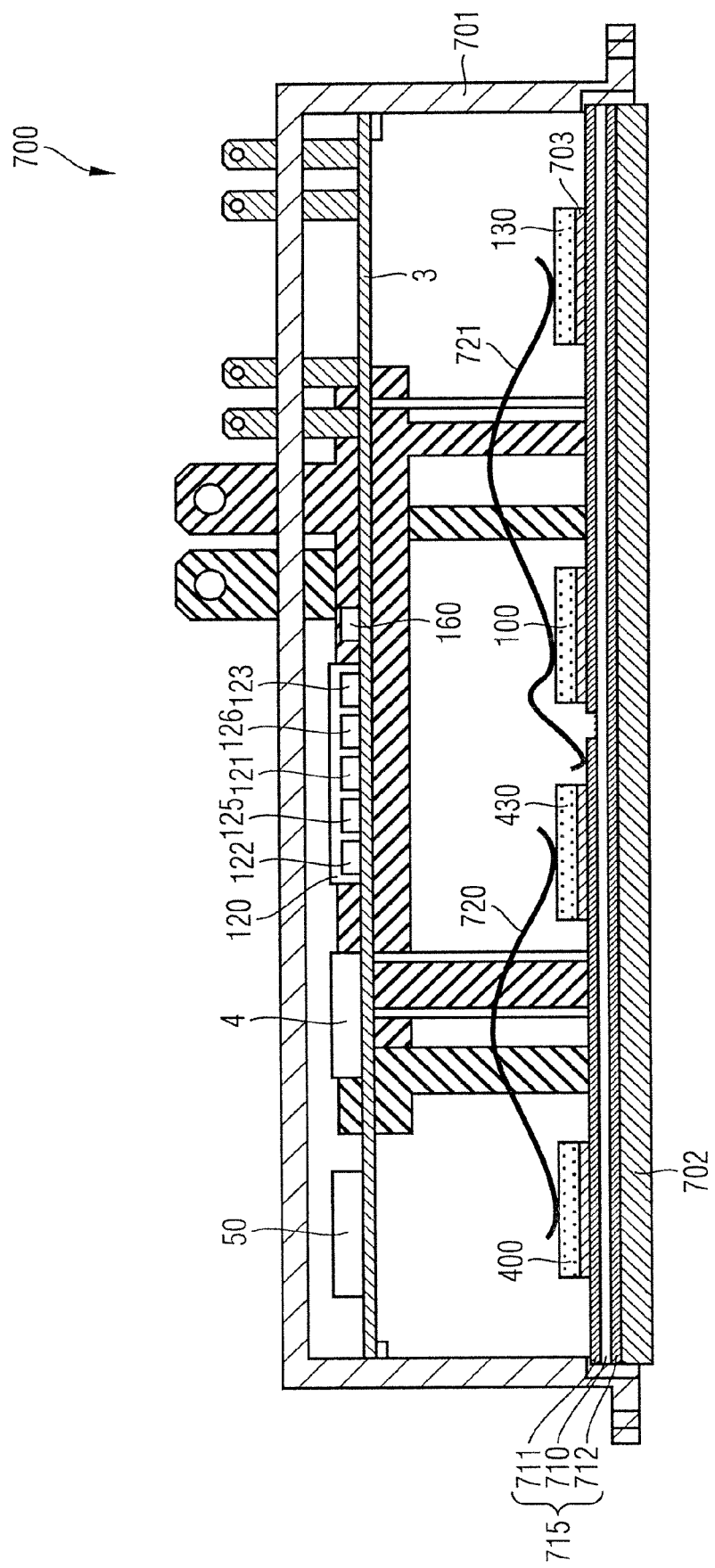
FIG. 17 is a cross-sectional view illustrating one embodiment through a power semiconductor assembly configured as a power semiconductor module in which a control circuit and a power section as illustrated in FIG. 3 are integrated according to one embodiment.

Referring now to FIG. 17 there is illustrated a cross-sectional view through a power semiconductor assembly 700 configured as a power semiconductor module in which a power section and an optional control section are integrated.

The power section includes a circuit assembly as shown in FIG. 2, the control section a control circuit as illustrated in FIG. 1. The power semiconductor module 700 includes a metallic baseplate 702 mounting one or more ceramic substrates 715 each including a ceramic carrier 710 topped by a metallization 711 patterned with tracks and contact pads and bottomed by a plain and non-patterned metallization 712. The topping metallization 711 mounts the power semiconductor switches 100, 200, 300, 400, 500 and 600 as well as the associated free-wheeling diodes 130, 230, 330, 430, 530 and 630 respectively by using a connecting layer 703, e.g., of solder or an electrically conductive adhesive to which they are mechanically and electrically connected. It is to be noted, however, that this cross-sectional view depicts only the components of the first half-bridge branch I as shown in FIG. 2.

Topping the power section is the substrate 3 equipped with the control circuit 1 as shown in FIG. 16 connected together with the power section by using electrically conductive connections (not shown). Evident in the present cross-sectional view from the many components arranged on the substrate 3 are merely the voltage source 50 for powering the power drivers 120, 220, 320 for controlling the low-side switches 100, 200 and 300 respectively, the control circuit 4, the power driver 120 as well as, assigned to the latter, the impedance components 121, 122, 123, buffer capacitors 125, 126 and the resistance 160.

The power semiconductor module 700 includes a cover 701 forming together with the baseplate 702 a casing housing the controllable power semiconductor switches 100, 200, 300, 400, 500 and 600, the associated free-wheeling diodes 130, 230, 330, 430, 530 and 630 respectively as well as the substrate 3 mounting the control circuit 1.

Figure 18:
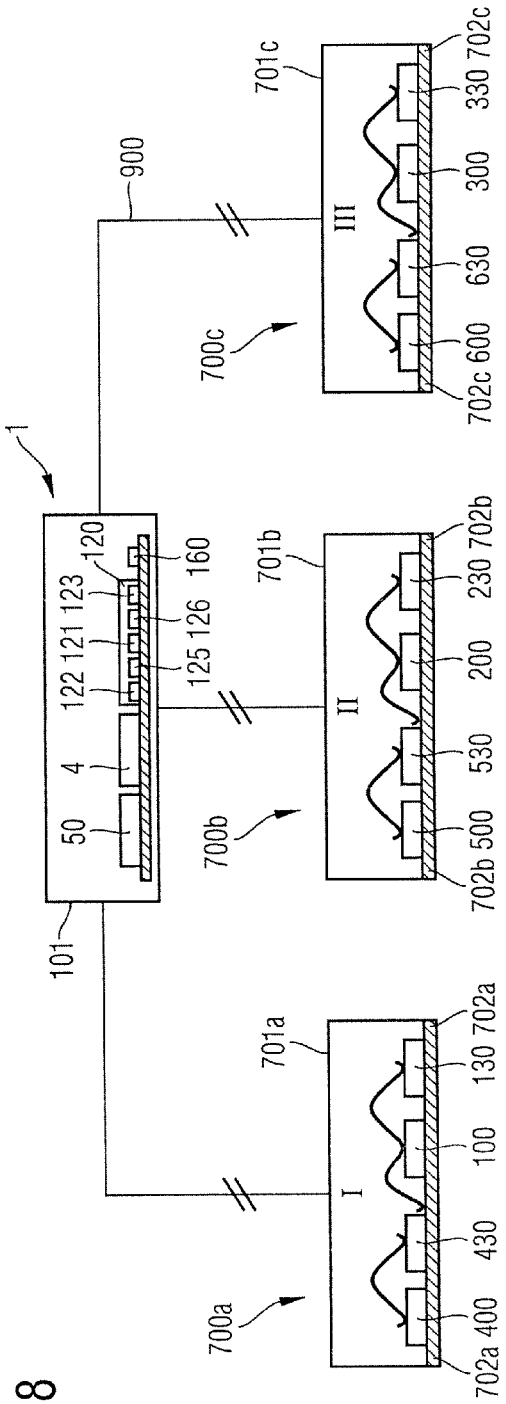
FIG. 18 is a view of a power semiconductor assembly illustrating one embodiment including several interconnected power semiconductor modules controlled by using a common control circuit arranged in a separate casing.

Referring now to FIG. 18 there is illustrated how in an alternative configuration of a power semiconductor assembly the control circuit 1 is arranged in an own casing connected by using a conductor system 900, e.g., a bus with one or more power semiconductor modules 700a, 700b, 700c to control them. For example, each of the power semiconductor modules 700a, 700b, 700c includes one of the half-bridge branches I, II and III as illustrated in FIG. 2. Each of the power semiconductor modules 700a, 700b, 700c has its own casing 701a/702a, 701b/702b, 701c/702c each including a cover 701a, 701b and 701c respectively and a baseplate 702a, 702b and 702c respectively.

Figure 19:
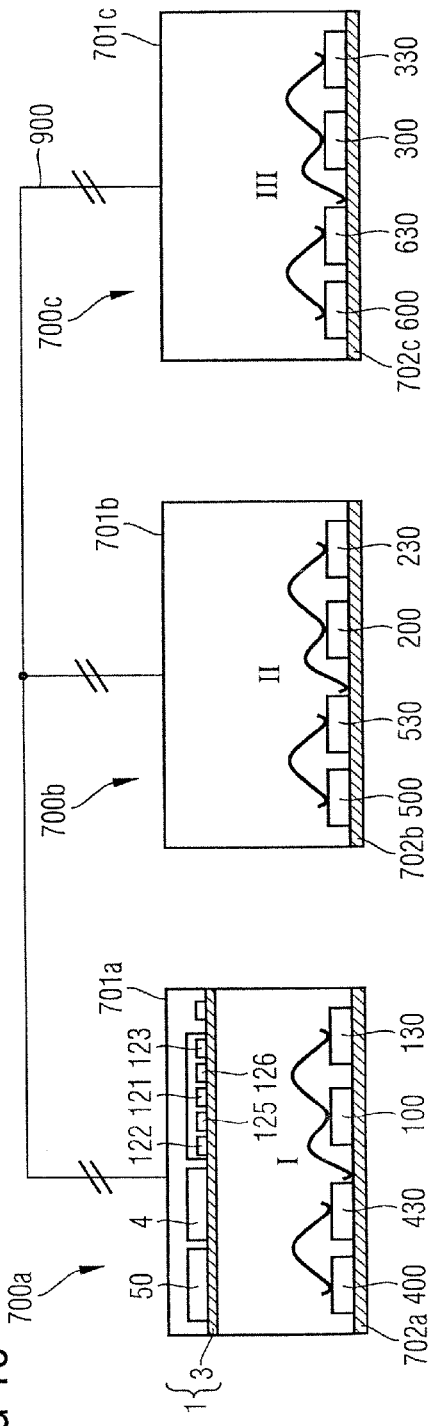
FIG. 19 is a view of a power semiconductor assembly illustrating one embodiment including several interconnected power semiconductor modules controlled by using a common control circuit integrated in a casing of one of the power semiconductor modules.

Referring now to FIG. 19 there is illustrated how, in another configuration of a power semiconductor assembly featuring at least two power semiconductor modules 700a, 700b, 700c the control circuit 1 is integrated in a power semiconductor module 700a of the power semiconductor modules 700a, 700b, 700c which are connected likewise by using a conductor system 900 including, among other things, conductors connecting the control circuit 1 integrated in the module 700a to the other modules 700b, 700c for their control.

Figure 20:
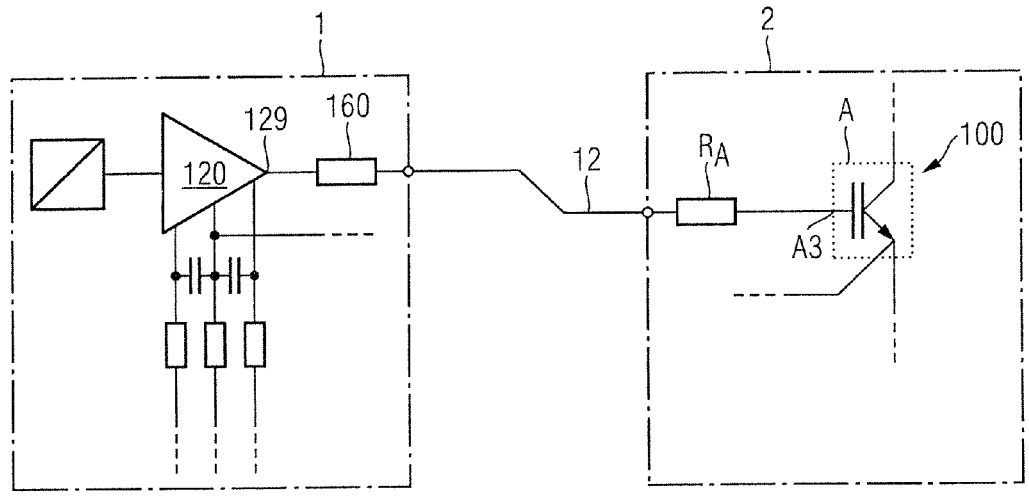
FIG. 20 is a detail of a power semiconductor assembly illustrating one embodiment including a control circuit as illustrated in FIG. 3 and a power semiconductor module as illustrated in FIG. 2 depicting only one of several possible low-side power drivers in the control circuit as an example; the power semiconductor module correspondingly illustrating only those of several possible controllable power semiconductor switches which are controlled by using the low-side power driver wherein the controllable power semiconductor switch is achieved by a single semiconductor chip.
Figure 21:
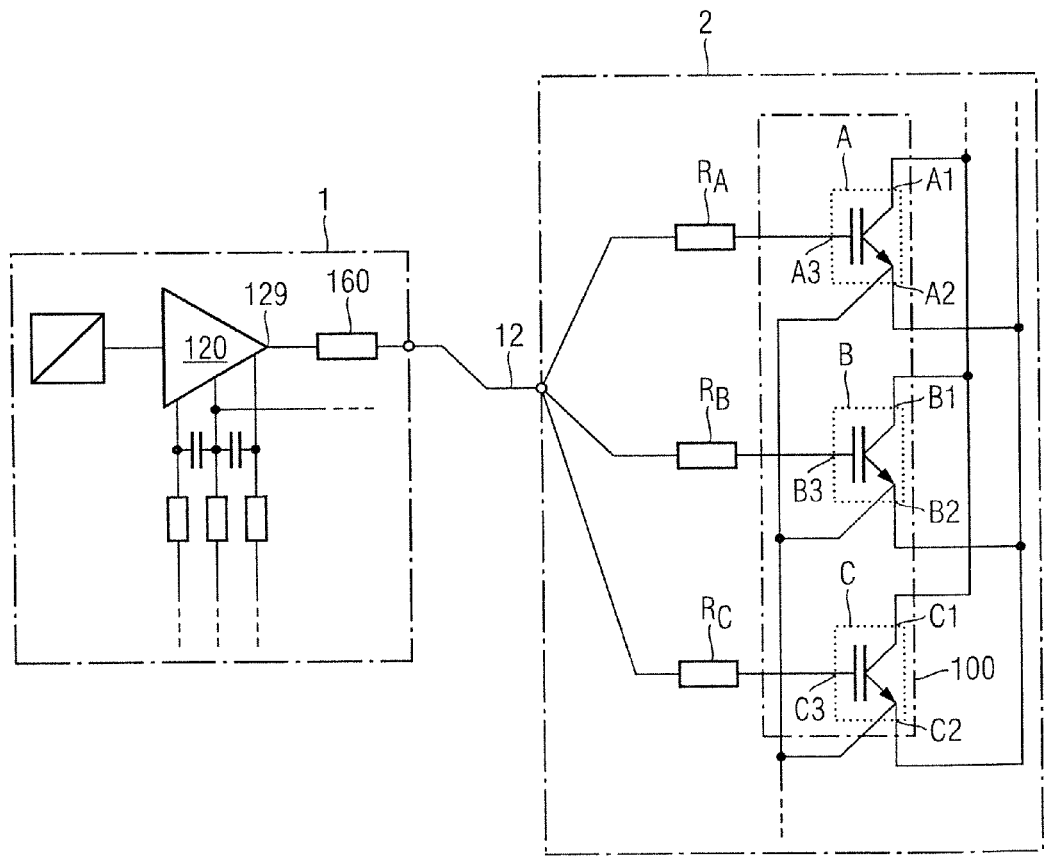
FIG. 21 is a view illustrating one embodiment of a power semiconductor assembly the same as that as illustrated in FIG. 19 with the difference that the controllable power semiconductor switch is achieved by several semiconductor chips electrically connected in parallel upstream of each of which a dedicated dropping resistance is provided.

Referring now to FIGS. 20 to 22 in conclusion there is illustrated how the controllable power semiconductor switches 100 are provided as described with reference to FIG. 2 and the sections of a control circuit 1 belonging thereto as illustrated in FIG. 1 to assist explaining how the corresponding gate resistance is established.

In the power semiconductor module 1 as illustrated in FIG. 20 the controllable power semiconductor switch 100 includes precisely one semiconductor chip A including a control contact A3, e.g., a metallization topping the semiconductor body of the semiconductor chip A. Control is done by using a power driver 120 of the control circuit 1, the output 129 of which is connected via an optional resistance 160, a lead 12 between the control circuit 1 and the power semiconductor module 2 as well as via an optional resistance RA with the control contact A3. It is understood in the wording of the present invention that the gate resistance includes all of the resistance from the output 129 of the power driver 120 up to the control contact A3.

Referring now to FIG. 21 it is evident how, different to the assembly as illustrated in FIG. 20, the controllable power semiconductor switch 100 includes several, for example, identical semiconductor chips A, B and C connected in parallel having first load contacts A1, B1 or C1, second load contacts A2, B2 or C2 and third load contacts A3, B3 or C3. So that they are connected in parallel the first load contacts A1, B1 or C1 are conductively interconnected, the same as the second load contacts A2, B2 or C2 and the control contacts A3, B3 or C3. Included is a resistance 160 assigned to the output 129 of the driver 120 as well as the resistances RA, RB, RC assigned to the individual semiconductor chips A, B and C or integrated therein, connected upstream of the control contacts A3, B3 and C3 respectively of the corresponding semiconductor chips A, B and C. The gate resistance of the controllable power semiconductor switch 100 is viewed as the resistance as would materialize from connecting the resistance 160 with one of the resistances RA, RB, RC in parallel.

Added to this in the assemblies as shown in FIGS. 20 and 21 within the control circuit 1 and within the power semiconductor module are the corresponding resistances resulting from the connections, e.g., bond wires inside the module.

Although the examples as explained above have described with reference to FIGS. 1 to 3 a power semiconductor assembly together with the corresponding control circuit for three half-bridge branches and with reference to FIGS. 4 to 6 a power semiconductor assembly together with the corresponding control circuit for two power semiconductor switches connected in parallel, it is understood that basically the invention may be put to use with any power semiconductor assemblies including at least two low-side switches or at least two power semiconductor switches connected in parallel. In this arrangement each of these power semiconductor switches is in addition assigned a dedicated power driver in each of the power supply lines of which an impedance component is included configured as explained above.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A control circuit comprising
a control logic with at least two outputs each capable of providing a first control signal for controlling a controllable power semiconductor switch;
at least two circuit sets, precisely one each of which is assigned one of the outputs of the control logic and each of which comprises an input which is coupled/coupleable electrically to the output of the control logic assigned to the corresponding circuit sets;
each of the circuit sets comprising:
a power driver assigned to each circuit set which is coupled/coupleable electrically at the input side to the input of the corresponding circuit set;
a power supply connection set comprising at least two terminals which is coupled/coupleable electrically to precisely one of the power driver of the corresponding circuit set to connect the corresponding power driver to a voltage source for application to the corresponding circuit sets;
a signal common output and signal output for controlling the controllable power semiconductor switch;
wherein
each of the at least two terminals of the circuit sets is or may be connected electrically by using an impedance component to the power driver of the power supply connection set assigned to the corresponding power supply connection set, each impedance component comprising an impedance other than zero having an effective resistance and/or a reactance;
wherein in each of the circuit sets
one of the impedance components of the respective circuit set is connected, on its side facing the power driver of the respective circuit set, directly to the signal common output of the respective circuit set;
each of the other impedance components of the respective circuit set is connected, on its side facing the power driver of the respective circuit set, via a capacitor to the signal common output of the respective circuit set; and
the power for supplying the complete power driver of the respective circuit set is supplied via the impedance components of the respective circuit set only.

2. The control circuit of claim 1 wherein for none of the impedance components the magnitude of the impedance is determined mainly by circuiting the conductor tracks of a substrate and/or bond wires and/or contact pads.

3. The control circuit of claim 1, wherein precisely one, several or each of the impedance components comprises an ohmic resistance and/or an inductance.

4. The control circuit of claim 1 wherein at least one of the impedance components comprises a coil.

5. The control circuit of claim 1 wherein the impedance components of a circuit set comprise windings on a common coil core forming together therewith a common mode choke.

6. The control circuit of claim 1 wherein in precisely one, several or each of the circuit sets the corresponding power supply connection set each comprises precisely two terminals for connecting a unipolar power supply.

7. The control circuit of claim 6 wherein in the power supply connection set comprising precisely one, several or each of the precisely two terminals for connecting a unipolar power supply the impedance components assigned to the corresponding power supply connection set are coupled by using at least one buffer capacitor at their sides connected facing the power driver of the corresponding circuit set.

8. The control circuit of claim 1 wherein in precisely one, several or each of the circuit sets the corresponding power supply connection set comprises three terminals for connecting a bipolar power supply of which a first terminal is provided to connect a reference potential, a second terminal to connect a negative potential below the reference potential and a third terminal to connect a positive potential above the reference potential.

9. The control circuit of claim 8 wherein in precisely one, several or each of the power supply connection sets comprising three terminals for connecting a bipolar power supply of the impedance components assigned to the corresponding power supply connection set, the impedance component coupled to the terminal for the reference potential at the their side connected facing the power driver of the corresponding circuit set being coupled by using at least one buffer capacitor to the sides of the other impedance components of the corresponding circuit set connected facing the power driver of the corresponding circuit set.

10. The control circuit of claim 1 wherein one, several or each of the power drivers comprises an emitter follower with complementary bipolar transistors.

11. The control circuit of claim 1 wherein one, several or each of the power drivers comprises a source follower with two complementary MOSFETs.

12. The control circuit of claim 1 wherein one, more or each of the power drivers comprises an output stage with an inverting CMOS transistor stage.

13. The control circuit of claim 1 wherein any optional terminal of an optional power supply connection set is electrically conductively connected/connectable to one terminal each of any of the other power supply connection sets.

14. The control circuit of claim 1 wherein at least the control logic and the power drivers are arranged on a common substrate.

15. The control circuit of claim 1 wherein the power driver of each of the circuit sets comprises an output stage, the power supply of which is provided via the impedance components of the respective circuit set.

16. A power semiconductor assembly including a control circuit, and a number of controllable power semiconductor switches which corresponds to the number of circuit sets, the control circuit comprising:
a control logic with at least two outputs each capable of providing a first control signal for controlling a controllable power semiconductor switch of the controllable power semiconductor switches;
at least two circuit sets, precisely one each of which is assigned one of the outputs of the control logic and each of which comprises an input which is coupled/coupleable electrically to the output of the control logic assigned to the corresponding circuit sets;
each of the circuit sets comprising:
a power driver assigned to each circuit set which is coupled/coupleable electrically at the input side to the input of the corresponding circuit set;
a power supply connection set comprising at least two contacts which is coupled/coupleable electrically to precisely one of the power driver of the corresponding circuit set to connect the corresponding power driver to a voltage source for application to the corresponding circuit sets;
a signal common output and signal output for controlling a controllable power semiconductor switch;
wherein
each of the at least two contacts of the circuit sets is or may be connected electrically by using an impedance component to the power driver of the power supply connection set assigned to the corresponding power supply connection set, each impedance component comprising an impedance other than zero having an effective resistance and/or a reactance;
wherein in each of the circuit sets
one of the impedance components of the respective circuit set is connected, on its side facing the power driver of the respective circuit set, directly to the signal common output of the respective circuit set;
each of the other impedance components of the respective circuit set is connected, on its side facing the power driver of the respective circuit set, via a capacitor to the signal common output of the respective circuit set; and
the power for supplying the complete power driver of the respective circuit set is supplied via the impedance components of the respective circuit set; and
each of the controllable power semiconductor switches comprising a first load contact, a second load contact and a control contact wherein configured between the first load contact and the second load contact in each case is a load path which may be switched in an electrically conductive ON-state or in an electrically blocking OFF-state by using the corresponding control contact and each of the control contacts of precisely one of the controllable power semiconductor switches is coupled/coupleable electrically to an output of the power driver of precisely one of the circuit sets.

17. The power semiconductor assembly of claim 16 wherein for one, several or each of the circuit sets the magnitude of the impedance of one, several or all impedance components of the corresponding circuit sets is greater than 0.3 times the gate resistance for controlling the controllable power semiconductor switches which is coupled/coupleable to the output of the power driver of the corresponding circuit set, the gate resistance being given by the gate resistance in the coupled condition when the controllable power semiconductor switches may be coupled, and
the gate resistance in case the controllable power semiconductor switch is achieved by using a sole power semiconductor chip is given by the total resistance from the output of the power driver of the corresponding circuit set to a control contact of the power semiconductor chip;
the gate resistance in case the controllable power semiconductor switch is achieved by at least two power semiconductor chips electrically connected in parallel is given by the resistance resulting from electrically circuiting in parallel all total resistances from the output of the power driver of the corresponding circuit set up to a control contact of each of the power semiconductor chips connected in parallel;
the magnitude of the impedance for a frequency-dependent impedance component is defined as the magnitude of the impedance which the impedance component exhibits at the frequency at which the current through the output of the power driver belonging to the same circuit set as the impedance component features in its Fourier spectrum the largest amplitude by magnitude when the input of the corresponding power driver is connected to a square-wave control voltage.

18. The power semiconductor assembly of claim 17 wherein in at least one of the circuit sets in all impedance components of the corresponding circuit set the magnitude of the impedance is greater than 0.3 times the resistance of the control contact which is coupled/coupleable to the output of the power driver of said circuit set.

19. The power semiconductor assembly as set forth in claim 17 wherein the control contacts of the controllable power semiconductor switches are configured as gate contacts and in which the resistances of the control contacts are the gate resistances of the corresponding controllable power semiconductor switches.

20. The power semiconductor assembly of claim 19 wherein each controllable power semiconductor switch is achieved either by using precisely one semiconductor chip or by using at least two semiconductor chips connected in parallel, the gate resistance in the case of at least two semiconductor chips connected in parallel being given by the total gate resistance of the parallel circuit.

21. The power semiconductor assembly of claim 16 wherein the at least two terminals of the power supply connection set of each circuit set are connected to a common voltage source.

22. The power semiconductor assembly of claim 16 wherein the load path of precisely one, several or each of the at least two controllable power semiconductor switches is connected in series with a load path of each further power semiconductor switch.

23. The power semiconductor assembly of claim 22 wherein in precisely one, several or each of the pairs of the further power semiconductor switches and the controllable power semiconductor switches of the at least two controllable power semiconductor switches are connected to different voltage sources.

24. The power semiconductor assembly of claim 16 wherein the load paths of precisely two, more than two or each of the at least two controllable power semiconductor switches are electrically connected in parallel.

25. The power semiconductor assembly of claim 24 wherein the control contacts of the controllable power semiconductor switches electrically connected in parallel are coupled/coupleable to the same output of a common control logic.

* * * * *